l

US007129788B2

(12) United States Patent
Eckert et al.

(10) Patent No.: US 7,129,788 B2
(45) Date of Patent: Oct. 31, 2006

(54) METHOD AND APPARATUS FOR DRIVING A DIRECT CURRENT OR VOLTAGE CONTROLLED OSCILLATOR WITH MODULATION SLOPE FEEDBACK

(75) Inventors: Juergen Eckert, Neckarsulm (DE);
Thorsten Fahlbusch, Heilbronn (DE);
Burkhard Gehring, Heilbronn (DE);
Hans-Werner Groh, Ensdorf (DE);
Horst Haefner, Heilbronn (DE);
Hermann Hammel, Rot am See (DE);
Michael Hecker, Eppingen (DE);
Gerald Krimmer, Heilbronn (DE);
Reinhard Reimann, Heilbronn (DE);
Wolfgang Roeper, Neuenstein (DE);
Friedemann Schmidt, Asberg (DE);
Juergen Schnabel, Leingarten (DE);
Wolfgang Schneider, Tamm (DE);
Michael Vogt, Bad Rappenau (DE);
Hans-Peter Waible, Flein (DE)

(73) Assignee: Atmel Germany GmbH, Heilbronn (DE)

( * ) Notice: Subject to any disclaimer, the term of this patent is extended or adjusted under 35 U.S.C. 154(b) by 29 days.

(21) Appl. No.: 10/833,418

(22) Filed: Apr. 27, 2004

(65) Prior Publication Data
US 2004/0233009 A1 Nov. 25, 2004

(30) Foreign Application Priority Data
Apr. 28, 2003 (DE) .............................. 103 20 513

(51) Int. Cl.
*H03L 7/085* (2006.01)
*H03L 7/08* (2006.01)
(52) U.S. Cl. ...................... 331/1 A; 331/16; 331/36 R; 331/36 C

(58) Field of Classification Search ................ 331/1 A, 331/16; 332/127, 128; 375/334; 455/120, 455/125, 126, 260, 264
See application file for complete search history.

(56) References Cited

U.S. PATENT DOCUMENTS
4,309,674 A    1/1982   Owen ........................... 332/18

(Continued)

FOREIGN PATENT DOCUMENTS
DE           2935582           3/1980

(Continued)

OTHER PUBLICATIONS

Modern Dictionary of Electronics by Rudolf F. Graf, 1978, p. 459.*

(Continued)

*Primary Examiner*—Tuan T. Lam
(74) *Attorney, Agent, or Firm*—W. F. Fasse; W. G. Fasse

(57) ABSTRACT

A d.c. signal controlled oscillator includes a frequency-determining network having a control input and a modulation input. A phase regulating loop includes the oscillator and components that provide a control signal to the control input. A circuit apparatus for driving the oscillator includes a modulation generator that provides a modulation signal to the modulation input, and a circuit arrangement that autonomously generates a signal depending on and representing a slope of the modulation and provides this slope signal to the modulation generator, which generates the modulation signal dependent on the slope signal. A method of operating the oscillator involves switching a frequency divider successively to two different frequencies, respectively sampling and holding the two different arising control voltages, forming a difference between the two control voltages, and activating the modulation generator so that a modulation swing of the modulation signal is determined by this difference between the control voltages.

34 Claims, 3 Drawing Sheets

U.S. PATENT DOCUMENTS

| | | | | |
|---|---|---|---|---|
| 4,481,489 A | * | 11/1984 | Kurby | 332/119 |
| 5,036,295 A | * | 7/1991 | Kamitani | 331/10 |
| 5,483,203 A | * | 1/1996 | Rottinghaus | 331/10 |
| 5,600,279 A | * | 2/1997 | Mori | 331/36 C |
| 6,515,553 B1 | * | 2/2003 | Filiol et al. | 332/127 |
| 6,670,861 B1 | * | 12/2003 | Balboni | 332/103 |
| 6,717,476 B1 | * | 4/2004 | Suto | 331/23 |
| 2001/0007151 A1 | * | 7/2001 | Vorenkamp et al. | 725/151 |

FOREIGN PATENT DOCUMENTS

| | | |
|---|---|---|
| EP | 0766375 | 4/1997 |
| WO | WO82/03510 | 10/1982 |

OTHER PUBLICATIONS

"Bluetooth Single-Chip Transceiver IC" T2901, Atmel Wireless & µc; Rev.A4; Nov. 17, 2000; pp. 1(29) to 29(29).

* cited by examiner

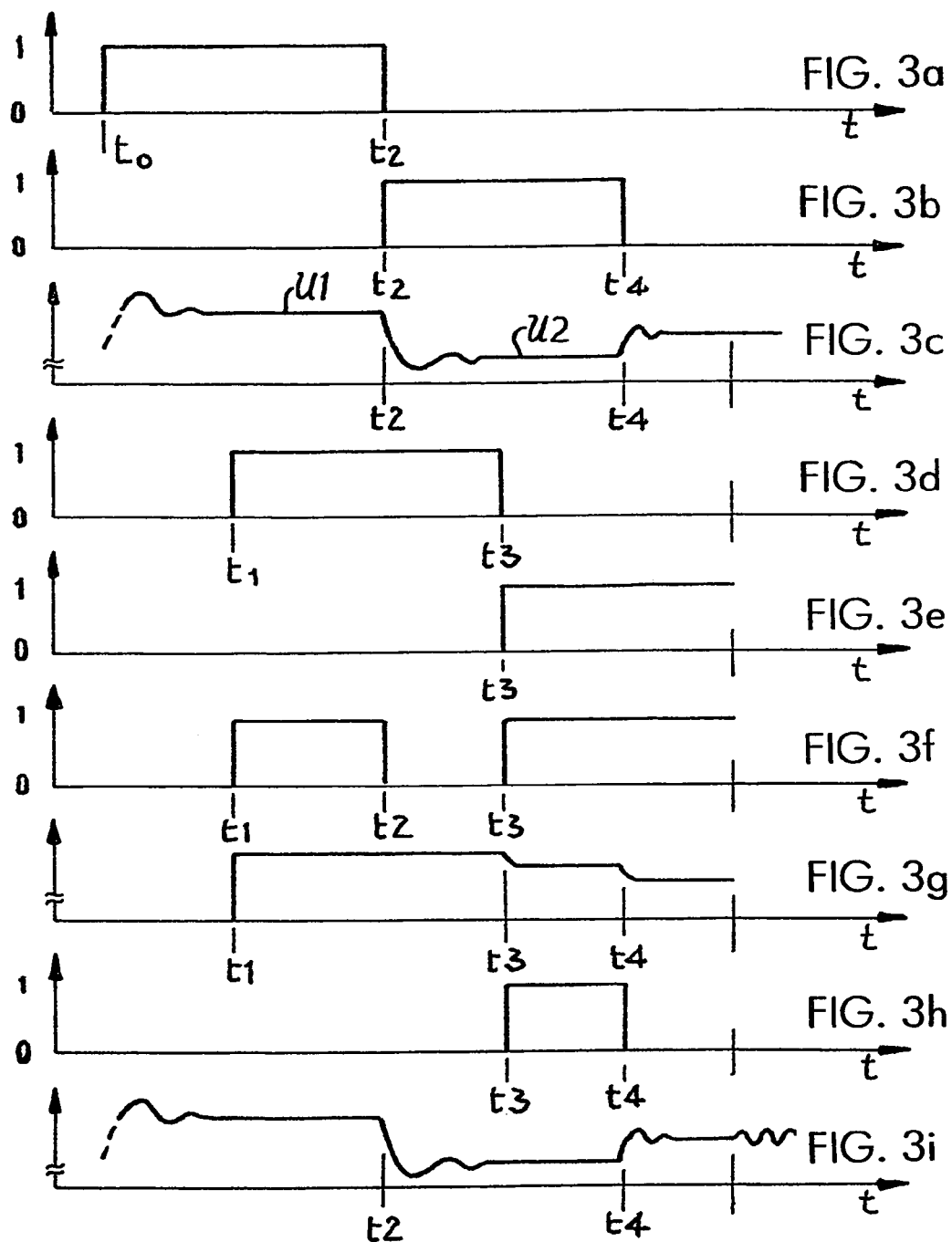

METHOD AND APPARATUS FOR DRIVING A DIRECT CURRENT OR VOLTAGE CONTROLLED OSCILLATOR WITH MODULATION SLOPE FEEDBACK

PRIORITY CLAIM

This application is based on and claims the priority under 35 U.S.C. §119 of German Patent Application 103 20 513.6, filed on Apr. 28, 2003, the entire disclosure of which is incorporated herein by reference.

FIELD OF THE INVENTION

The invention relates to both a method and an apparatus for driving an oscillator that is controlled by an electrical d.c. signal, which may be a direct current signal or a direct voltage signal, wherein the oscillator includes a d.c. signal sensitive network of frequency-determining components with a control input and a modulation input. The apparatus includes a phase regulating loop that provides a control signal to the control input, and a modulation generator that provides a modulation signal to the modulation input.

BACKGROUND INFORMATION

Conventional circuit arrangements and methods of the above-mentioned general type are known. In fact, this type of frequency generation is typical in practically all present-day circuit arrangements for generating a frequency modulated transmission signal with several channels. The oscillator provides a carrier frequency that is modulated by an information signal. In this context, the modulation swing or range of the modulation of the signal refers to the deviation of the frequency of the modulated signal relative to the carrier frequency.

The d.c. signal for controlling the oscillator can be a d.c. control voltage or a d.c. control current. The frequency-determining components of the network of the oscillator may comprise especially capacitances and/or inductances, i.e. physically capacitors and/or inductors. A phase regulating loop, and particularly a phase-locked loop (PLL), used in such a circuit arrangement typically consists of the oscillator, a phase/frequency detector to which the signal of the oscillator and a reference frequency are provided, and a loop filter that filters the output signal of the phase/frequency detector and forms thereof a d.c. signal as a control signal for the oscillator. In the circuit loop, the components cooperate in such a manner so that the oscillator frequency approaches and approximates the reference frequency.

In principle, frequency modulated transmitters can be driven or operated over a wide range of various differently-dimensioned frequency swings. However, the signal-to-noise ratio of the demodulated signal becomes ever worse as the frequency swing gets smaller. That means that the transmission range diminishes for the same transmitting power, or viewed alternatively, more transmitting power is required to achieve the same transmission range. On the other hand, as the frequency swing gets larger, the ratio between the transmission range or distance and the transmitting power becomes evermore advantageous. However, in this context, simultaneously the spectral bandwidth occupied by the transmitter increases sharply, especially above the transition from narrow band to wide band frequency modulation (FM). As a result, the arising adjacent channel interference becomes unacceptably strong, or the interchannel spacing or separation must be substantially increased in view of these effects, so that as an ultimate consequence, the number of useable channels in the allocated frequency band is sharply reduced.

In view of the above effects and the results thereof, the ability to maintain the modulation swing as exactly as possible is a very important quality criterion for evaluating every frequency modulating transmitting arrangement. Moreover, the maximum and minimum limits or boundaries of the permissible modulation swings are very often pre-scribed or regulated in the applicable industry standards, for example especially in connection with the present-day typical digital modulation processes such as frequency shift keying (FSK) and its variants.

In connection with the above considerations, it is generally known that the fabrication tolerances in the production of the components such as capacitors, coils, varactor diodes, etc. used in such circuit arrangements generally are not adequate in order to ensure a sufficient accuracy of the modulation swing. In the past, it was typical to provide for the adjustment of the modulation swing by manual trimming of the circuit arrangement through the use of a trimming potentiometer. Today it is typical to install digitally adjustable amplifying elements or damping elements at suitable locations within the modulation signal path for carrying out the required adjustment, or to digitally adjust the amplitude of the modulation signal already in the generation of the signal. In this context, the adjustment value is typically stored in an EEPROM. In other words, the scatter or spread of the modulation swing caused by production tolerances and the like has typically been reduced by additional adjustment or balancing, either by hand or by digitally storing adjustment values in connection with the final testing of the device, so that the required device specifications would be met and maintained by new devices.

It is disadvantageous in the above described conventional approaches to achieve the required modulation swing, that the manual adjusting or the testing and storing of digital adjustment values necessitate additional work steps in the production of the device, which lead to additional costs of the device. Furthermore, the parameters adjusted to achieve the required modulation swing of the device at the end of the manufacturing process can never match the true optimal values for the actual real world application or use of the device in the field. For example, this is true already because reserves must be provided, or an over-adjustment must be carried out, in order to allow for long time drift, temperature dependence, supply voltage dependence, dependence on the actual present selected channel frequency, and the like in the actual utilization of the device. Even if such factors are taken into account, there can be no absolute assurance that the assumed drift values and the like will actually apply to a particular sample of a device. In other words a particular sample of the device may significantly overshoot or undershoot the expected nominal drift behavior.

SUMMARY OF THE INVENTION

In view of the above, it is an object of the invention to provide a circuit arrangement or apparatus of the above mentioned general type, as well as a method of operating such a circuit arrangement, which ensure that a certain specified modulation swing can be maintained in every case independent of effects such as long term drift, temperature dependence, supply voltage dependence, and dependence on the present actual adjusted channel frequency. It is a further object of the invention to avoid the need of an additional testing and/or adjusting process during the production of the circuit arrangement, in order to thereby avoid the arising additional costs. The invention further aims to avoid or overcome the disadvantages of the prior art, and to achieve additional advantages, as apparent from the present specification. The attainment of these objects is, however, not a required limitation of the present invention.

The above objects have been achieved according to the invention in a circuit apparatus for driving or operating a d.c. signal (current or voltage) controlled oscillator including a d.c. signal sensitive network of frequency-determining components having a control input and a modulation input. The inventive circuit apparatus comprises a phase regulating loop that provides a control signal to the control input of the oscillator, a modulation generator that provides a modulation signal to the modulation input of the oscillator, and a further circuit arrangement integrated into the apparatus, which autonomously generates a signal dependent on or indicative of the effective slope of the modulation and provides this signal to the modulation generator, whereupon the modulation generator generates the modulation signal dependent on the received modulation slope signal. Thus, the modulation signal generated by the modulation generator is dependent on feedback that the modulation generator receives regarding the actual existing modulation slope of the modulation. That has the effect of counteracting or compensating for any and all factors, such as long term drift, temperature dependence, or the like, that influence the actual modulation.

The above objects have further been achieved according to the invention in a method of driving or operating an electrical d.c. signal controlled oscillator having the above mentioned components and arrangement, and further including a switchable frequency divider that is coupled with the oscillator in the phase regulating loop, comprising the following steps: switching the frequency divider to a first frequency; sampling and holding a first control voltage that arises or is established at the first frequency; switching the frequency divider to a second frequency; sampling and holding a second control voltage that arises or is established at the second frequency; forming a difference between the first control voltage and the second control voltage; and driving or activating the modulation generator dependent on the formed difference, so that the oscillation width or swing of the modulation voltage is determined by this difference between the first and second control voltages.

Through the just mentioned characteristic features of the invention, the objects of the invention are entirely achieved, and the above mentioned problems relating to the general principle of such circuits and methods in the prior art have been solved or avoided. The invention thus makes it possible to achieve an autonomous, self-adjusting, always-recovering, optimal adjustment of the modulation swing, so that drifting or dependence on the actual presently prevailing conditions can no longer have any influence on the modulation swing. In this context, the slope of the modulation is defined by normalizing a frequency variation relative to the variation of the modulation signal that is caused by the frequency variation. In a similar manner, the slope of the control can be defined by a change or variation of the frequency, which is normalized on a corresponding change or variation of the control signal. According to the invention, by determining the modulation slope, it becomes possible to unambiguously determine a modulation signal that is necessary for a particular desired modulation swing.

A preferred embodiment of the invention further comprises a digital control unit and a frequency divider that is operated by the digital control unit and that is switchable between or among several frequencies. Furthermore, the frequency divider is coupled with the controlled oscillator in the phase regulating loop. Such a circuit arrangement of a frequency divider is known in the context of conventional systems for switching transmission channels. However, as a further development, the present invention achieves the additional advantage of using such a feature, i.e. a frequency divider connected in such a manner, that is already available in typical conventional systems, for additionally forming a signal responsive to and indicative of the modulation or control slope for achieving an automatic adjustment, tuning or balancing of the oscillator. In other words, the particular advantage achieved in this context is that the invention makes use of the frequency switching for more than one purpose, and thereby avoids the need of a separate circuit component or arrangement that would otherwise be needed for only adjusting or balancing purposes.

It is further preferred according to the invention, that the frequency selective network is embodied so that the ratio of the slopes with which the oscillator reacts to changes or variations of the control and of the modulation signal corresponds to the ratio of the frequency change or variation upon switching the frequency divider relative to the modulation swing. With this embodiment, frequency variations that are triggered by switching of the frequency divider, and that lead to variations of the control voltage, can be used for determining a slope value that corresponds to the modulation slope. While the determined slope initially relates to the control input, it can be evaluated as a measure of the modulation slope due to the above mentioned ratio or relationship therebetween. In other words, with this embodiment, known values of the slope on the control side of the oscillator can be transferred also to the modulation side. Therefore, it is possible to omit a separate circuit arrangement for directly determining the modulation slope.

In this context it is preferred that the frequency selective network comprises two mutually symmetrical parallel circuits of (e.g. varactor) diodes with voltage dependent depletion layer capacitances, whereby respectively one of these parallel circuits is coupled with the control input and one of these parallel circuits is coupled with the modulation input, and these parallel circuits are both coupled in common with a resonant circuit that forms the core of the oscillator. This embodiment is simple with regard to its construction and manufacturing technology, and is therefore economical with regard to the costs, yet achieves the desired correspondence between the ratio of the slopes with which the oscillator reacts to changes of the control signal and of the modulation signal, and the ratio of the frequency change or variation upon switching the frequency divider with respect to the modulation swing.

According to another preferred feature, the electrical direct signal, i.e. d.c. signal, is a d.c. voltage signal. With this feature, the invention becomes useable in connection with the extremely common and broadly used voltage controlled oscillators (VCO). However, the use or application of the invention is not limited to voltage controlled oscillators, but may alternatively be used in connection with current controlled oscillators. Namely, in the latter case, the direct or d.c. signal is a d.c. current signal.

It is additionally preferred that the apparatus further comprises a series circuit of an impedance converter and a resistor between the control input and the modulation input, whereby the control input is connected with the impedance converter. This series circuit ensures that both sides, namely the control side and the modulation side, have the same d.c. voltage operating point. Thereby, it is possible to use broadly available varactor diodes, i.e. diodes of which the voltage dependence of the depletion layer capacitance is nonlinear. Further in this regard, the series circuit exhibits a synchronism, so to speak, between the varactor diodes at the control input and the varactor diodes at the modulation input, which synchronism is basically required for the functioning or operation of the system.

A further preferred embodiment is characterized by the use of a time-discrete subtracting element, which detects the respective voltage present at the input or the output of the impedance converter in a time-discrete manner in the two switching positions of the switchable divider, and then provides a difference between the two detected voltage values as a signal that is representative or indicative of the slope. This embodiment provides a relatively simple and economical manner of determining the slope, because the above mentioned difference between the two detected control voltages for the two different frequency settings is inversely proportional to the slope.

It is further preferred according to the invention to use a digital control unit for controlling the time-discrete detection of the voltage values by the subtracting element. Thereby, the necessary synchronization between the switching of the frequency divider and the detection of the voltage values is achieved by simple and economical means. It is still further preferred according to the invention that the apparatus shall comprise an analog/digital converter that converts the analog difference between the detected voltage values into a digital signal, a memory that stores the digital signal, and a digital/analog converter with a current output that converts the stored digital signal into a control current and provides this control current to the modulation generator. This feature of the invention makes it possible to measure voltage values in an adjusting or balancing phase, then convert these voltage values into a control value for use in a later operating phase, then intermediately store the control value, and then later use the stored control value in the operating phase.

Further embodiments, features and advantages of the invention are evident from the specification and the accompanying drawings. It should be understood that the embodiments and features of the invention described herein are not limited to the particular combination or combinations as expressly set forth in the example embodiments, but are also useful and within the scope of the invention when provided in any other combinations or even individually.

BRIEF DESCRIPTION OF THE DRAWINGS

In order that the invention may be clearly understood, it will now be described in connection with example embodiments thereof, with reference to the accompanying drawings, wherein:

FIGS. 3*a* to 3*i* respectively show the time course or progression of various different signals that arise at various circuit nodes or locations of the circuits according to FIGS. 1 and 2.

DETAILED DESCRIPTION OF A PREFERRED EXAMPLE EMBODIMENT AND OF THE BEST MODE OF THE INVENTION

Figure 1:
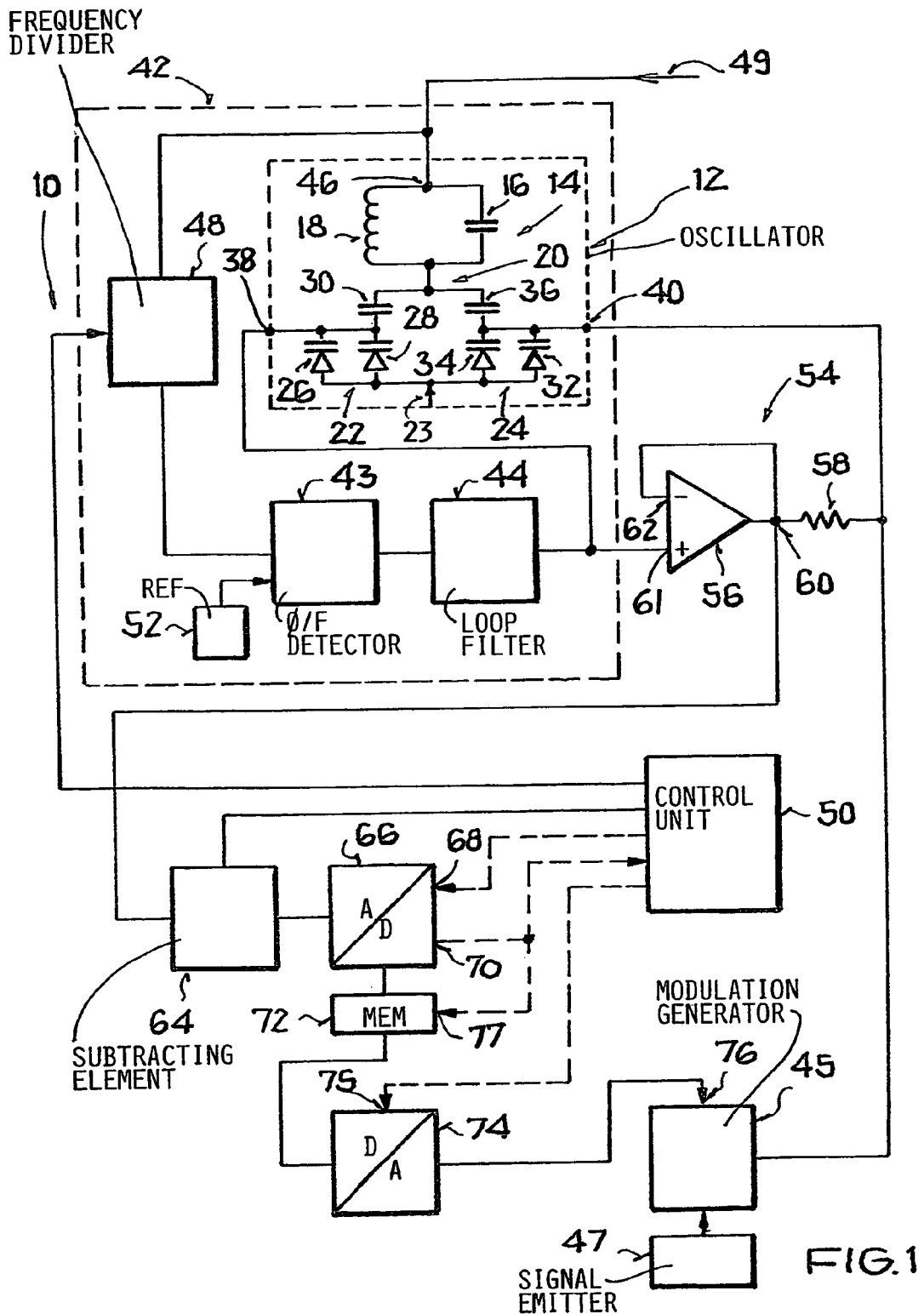
FIG. 1 is a schematic block circuit diagram providing an overview of an example embodiment of a circuit apparatus according to the invention.

FIG. 1 schematically shows an example embodiment of the inventive circuit apparatus 10 for operating or driving an oscillator 12 that is controlled by an electrical d.c. signal, which may be either a d.c. voltage signal or a d.c. current signal, but is here preferably a d.c. voltage signal. For reasons of simplicity and clarity of the drawing, FIG. 1 shows the oscillator 12 in a simplified form without any active components. Basically, the oscillator 12 comprises an oscillator core including a resonant circuit 14 of a capacitance 16 and an inductance 18 connected in parallel. The capacitance and inductance can be concretely embodied as a capacitor 16 and an inductor 18, respectively.

Further, the resonant circuit 14 is connected via a network 20 of frequency-determining components with a control input 38 as well as a modulation input 40 of the oscillator 12. The network 20 of frequency-determining components comprises a first parallel circuit 22 of varactors 26 and 28, and a second parallel circuit 24 of varactors 32 and 34, as well as two capacitors 30 and 36. More particularly, the first parallel circuit 22 is connected with the control input 38 and is also connected via the capacitor 30 with the resonant circuit 14. Similarly, the second parallel circuit 24 is connected with the modulation input 40, and is connected via the capacitor 36 with the resonant circuit 14. Moreover, the two parallel circuits 22 and 24 are connected parallel with each other between a common network junction 23 and the resonant circuit 14. A bias voltage is applied at the common network junction 23.

A phase regulating loop 42 generates a control signal that is provided to the control input 38. The phase regulating loop 42 includes or encompasses the oscillator 12, and additionally, a switchable frequency divider 48, a phase/frequency detector 43, and a loop filter 44. More particularly, this phase regulating loop 42 generates a carrier signal that is modulated in the oscillator 12 via or in response to a modulation signal provided at the oscillator's modulation input 40, and then is prepared for use by a subsequent or following circuit. As an example, this subsequent or following circuit can be a circuit for driving an antenna 49. The carrier frequency is defined as an integer (or whole number) multiple of a reference frequency, which is provided by a reference frequency emitter or transducer 52, which may, for example, be a resonating or oscillating crystal or the like.

In order to carry out a comparison with the reference frequency, the output signal of the oscillator 12 is provided from the output 46 thereof to the switchable frequency divider 48, which divides the frequency of the oscillator 12 in an integer (or whole number) ratio. Then, the signal provided by the frequency divider 48 to the phase/frequency detector 43 has a similar frequency as the reference frequency signal provided by the reference frequency transducer or emitter 52. The two signals are compared with one another in the phase-frequency detector 43. For this purpose, for example, two square wave or rectangular wave signals that respectively have the corresponding frequencies can be multiplied with one another. As a result, the output is a square wave or rectangular wave signal having the double frequency, of which the pulse duty ratio is dependent on the phase shift, and thus also the frequency shift, between the two frequency signals. This pulse duty ratio is low-pass-filtered in the following loop filter 44, Buch that the loop filter 44 then provides a d.c. voltage as a control voltage to the control input 38 of the oscillator 12. Thereby, this control voltage is dependent on the pulse duty ratio and thus on the frequency and/or phase shift between the input signals of the phase/frequency detector 43.

The control voltage applied to the control input 38 is effective through the network 20 of frequency-determining components in a detuning manner on the resonant circuit 14. As a result thereof, the carrier frequency provided at the output 46 of the oscillator 12 is a whole number or integer multiple of the reference frequency. Via the modulation input 40 of the oscillator 12, a respective desired signal information or data is modulated onto this carrier frequency. For this purpose, a signal emitter 47 provides the desired data or information in an input signal to a modulation generator 45, which then generates modulation control voltages dependent on its input signal. These modulation control voltages are provided as a modulation signal to the modulation input 40 of the oscillator 12 and have the effect of detuning the oscillator so as to thereby achieve a frequency modulation of the above mentioned carrier frequency. In this regard, the frequency shift caused by a change or variation of the modulation signal is designated as the modulation swing. By normalizing the modulation swing on or with respect to the change or variation of the modulation signal, the slope of the modulation is defined.

The control input 38 is connected with the modulation input 40 of the oscillator 12 via a series circuit 54 of an operational amplifier, which is arranged or connected as an impedance converter 56, and a resistor 58. In this context, the control input 38 of the oscillator is connected with the non-inverting input 61 of the impedance converter 56 embodied by the operational amplifier. On the other hand, the inverting input 62 of the operational amplifier, i.e. the impedance converter 56, is connected with the output of the amplifier and with a base terminal 60 of the resistor 58, which represents a midpoint or center node of the series circuit 54. Due to the circuit connection or arrangement of the operational amplifier as an impedance converter 56, the potential at the base terminal 60 corresponds to the potential at the control input 38, which is also the potential applied to the non-inverting input 61 of the operational amplifier. Due to the connection of the base terminal 60 with the modulation input 40 via the resistor 58, so to speak, the base potential of the modulation input 40 is connected or linked to the potential of the control input 38. Thereby, the base potential of the modulation input 40 will be caused to follow changes or variations of the control potential at the control input 38. As a result, the modulation signal emitted by the modulation generator 45 can still modulate the carrier frequency in a reproducible controlled manner, even in connection with a change or variation of the control voltage at the control input 38 of the oscillator 12. Further in this regard, the operational amplifier connected in the manner of an impedance converter 56 prevents an undesired reaction or feedback of the modulation signal on the control signal.

The following discussion will explain how the modulation slope in the operation of the oscillator 12 is determined and, if necessary, corrected. To carry out such a determination and correction, i.e. an adjustment or balancing, of the modulation slope, a digital-control unit 50 first switches the switchable frequency divider 48 into a first switching position, in which the output frequency of the oscillator 12 is divided by a first factor. If the dividing factor in the normal operation of the oscillator 12 is equal to "n", the first factor that is selected initially may, for example, be equal to "n+1". Thereby, the oscillator 12 oscillates, so to speak, onto an adjacent channel n+1 having the respective associated frequency. Also, through the phase regulating loop 42, a value for the control voltage associated with the frequency of the channel n+1, will be established at the control input 38 of the oscillator 12. As described above, this voltage also prevails at the base terminal 60 and thus also at the input of the time-discrete operating subtracting element 64.

In the further course of the automatic adjustment or balancing, the digital control unit 50 switches the frequency divider 48 to a further frequency, for example corresponding to an adjacent channel n−1. As a result, through the phase regulating loop 42, a second value of the control voltage will be established at the control input 38 of the oscillator 12. As described above, this second value of the control voltage will be delivered via the impedance converter 56 also to the input of the time-discrete subtracting element 64. The time-discrete subtracting element 64 then forms the difference between the two control voltage values of the channels n+1 and n−1. For a known frequency spacing between the channels n+1 and n=1, the slope at the control input of the oscillator 12 can be calculated from the difference of the control voltage values. Namely, the slope is inversely proportional to the difference between the control voltage values, whereby the frequency spacing or interval between the utilized channels (in this example n+1 and n−1) forms the proportionality factor.

The digital control unit 50 controls the time-discrete formation of the difference in the subtracting element 64. The digital control unit 50, via an input 68 of the analog/digital converter 66, also controls the beginning of the conversion of the difference signal provided by the subtracting element 64 into a digital value. An end or completion of the conversion in the analog/digital converter 66 is signaled through an output 70 of the analog/digital converter 66 to the digital control unit 50. Further functions associated therewith are described below with reference to FIG. 3a. Parallel thereto, the end of the conversion is signaled through the output 70 of the analog/digital converter 66 also to an input 77 of a memory 72, which then takes over and stores the difference of the control voltages as a digital value.

In the later operation of the circuit apparatus 10 with an average or middle frequency n, the digital value stored in the memory 72 is provided and converted through a digital/analog converter 74 into a control current signal at the current output thereof, and this control current signal is further provided to the control current input 76 of the modulation generator 45. In this context, the control current signal is dimensioned so that the modulation voltage swing output by the modulation generator 45 is dimensioned so that the resulting frequency swing (i.e. the modulation swing) arising at the output 46 of the oscillator 12 remains within predetermined limits or boundaries. In that regard, the taking-over of the digital value out of the memory 72 into the digital/analog converter 74 with a current output, is triggered by the control unit 50, which for this purpose transmits a corresponding signal to a control input 75 of the digital/analog converter 74 having the current output.

Figure 2:
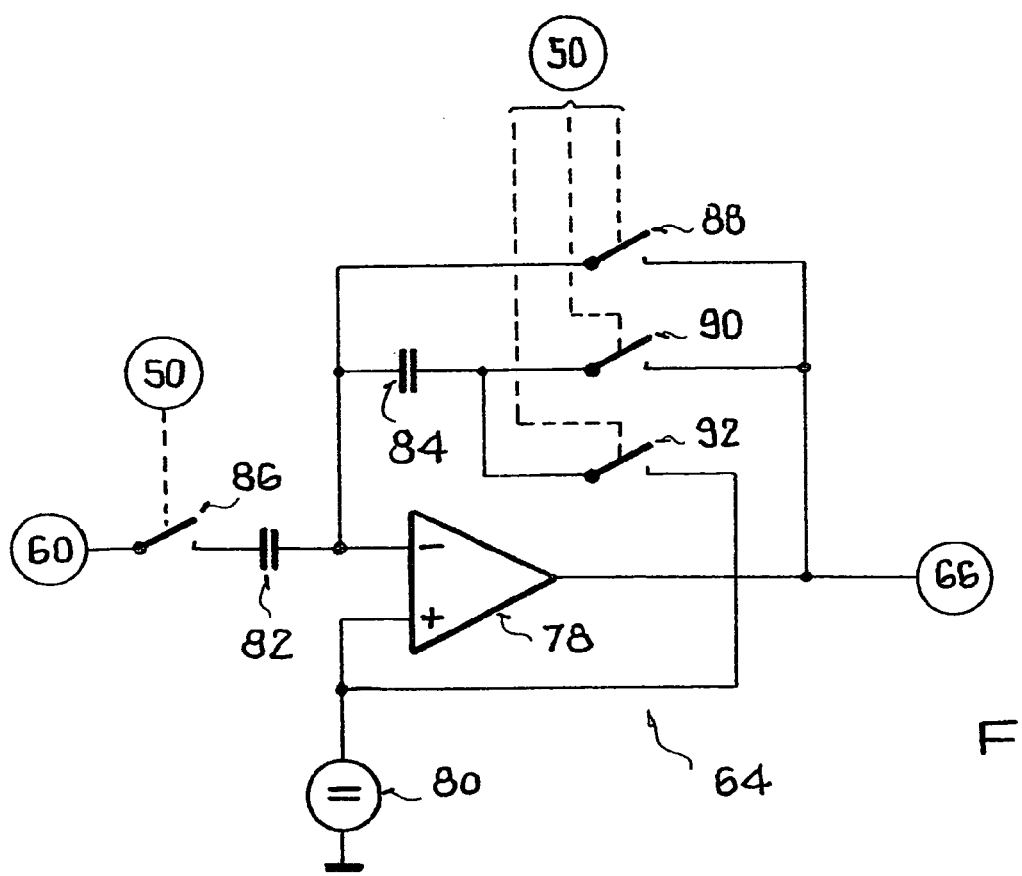
FIG. 2 is a schematic circuit diagram of a time-discrete subtracting amplifier arrangement that can be used in the apparatus of FIG. 1.

FIG. 2 shows an example embodiment of a time-discrete controlled subtracting element 64 in detail. The subtracting element 64 comprises an operational amplifier 78, of which the circuit connection with capacitors 82 and 84 can be varied through the controlled variation of the switching positions of switches 86, 88, 90 and 92 (e.g. embodied as transistors). The respective switching positions of the switches are controlled by the digital control unit 50. A biasing voltage source 80 is connected to the non-inverting input of the operational amplifier 78. The input side of the overall subtracting element 64 is connected with the base terminal 60 of the circuit apparatus shown in FIG. 1, and the output side of the subtracting element 64 is connected with the analog/digital converter 66 of the circuit apparatus according to FIG. 1. The subtracting element 64, particularly operating as a subtracting amplifier 64, is operated in two different switching positions as follows, in connection with the two different frequency settings of the frequency divider 48 as described above.

In a first switching position, the digital control unit 50 closes the switches 86, 88 and 92. Thereby, the inverting input of the operational amplifier 78 is short-circuited with its output. Thus, the operational amplifier 78 operates as an impedance converter for the biasing voltage potential (from 80), which is applied to the non-inverting input. With the switch 86 being closed, simultaneously the capacitor 82 will be charged. Thereby the switching positions of the subtracting element 64 are controlled by the digital control unit 50 in such a manner with respect to the switching of the frequency divider 48, so that the capacitor 82 will first be charged with the first control voltage with the closed switch 86. The complete charging of the capacitor 82 thus corresponds to a sampling and switching of the first control voltage.

Thereafter, the digital control unit 50 switches the frequency divider 48 to the channel n−1, so that, after a transient build-up phase, a second control voltage is established at the control input 38 of the oscillator 12, and via the base terminal 60 also at the input of the subtracting element 64. Meanwhile, the control unit 50 opened the switch 86. After the switch 86 was intermediately opened, the digital control unit 50 again closes the switch 86 and closes the switch 90 after the transient build-up of the second control voltage, while also opening the switches 88 and 92. In this second switching position, the output of the operational amplifier 78 is connected via the capacitor 84 with the inverting input of the operational amplifier 78. This circuit connection of the amplifier 78 corresponds to an integrator. Due to the parallel or simultaneous closing of the switch 86, the second control voltage is thus applied to the capacitor 82, which thereby is recharged to the second control voltage level.

In other words, the charge condition of the capacitor 82 changes or varies according to the voltage variation from the first control voltage to the second control voltage. Due to its circuit connection as an integrator, the operational amplifier 78 converts each recharging of the capacitor 82 into a change or variation of its output voltage in the ratio of the capacitances of the capacitor 82 relative to the capacitor 84. Because the recharging of capacitor 82 is proportional to the difference between the control voltages in the channels n+1 and n−1 respectively, after switching-over the switches 86, 88, 90 and 92 into the second switching position, the operational amplifier 78 will provide an output voltage that is proportional to the difference between the control voltage values and therewith inversely proportional to the modulation slope.

FIG. 3, including or made up of FIGS. 3a to 3i, shows the course or progression over time of various different signals at different locations or circuit nodes in the circuit apparatus 10 according to FIG. 1.

In FIG. 3a, the time interval t0 to t2 in which the illustrated signal has the logic value 1 represents the time during which the frequency divider 48 is switched to the channel n+1. Analogously, FIG. 3b shows the time interval t2 to t4 in which the channel n−1 is activated.

As illustrated in FIG. 3c, the control voltage at the control input 38 of the oscillator 12 transiently builds up to a first control voltage value U1 during the time interval t0 to t2 in which the frequency divider 48 is switched to the channel n+1. FIG. 3c then further shows that the control voltage at the control input 38 of the oscillator 12 transiently decays from the first control voltage value U1 to a lower second control voltage value U2 during the time interval t2 to t4 while the frequency divider 48 is switched to the channel n−1.

FIG. 3d represents a control signal with which the digital control unit 50 closes the switches 88 and 92 and thereby controls the time-discrete subtracting element 64. In the time interval t1 to t3 in which this control signal illustrated in FIG. 3d has the logic value 1, the above mentioned switches 88 and 92 are closed, so that the subtracting element, i.e. the subtracting amplifier 64, is placed into the above described first switching position.

At least parallel in time to the above mentioned control signal of FIG. 3d, a control signal shown in FIG. 3f is also set to the logic value 1, e.g. in the time interval t1 to t2, so as to thereby close the switch 86. At the time point t2, the digital control unit 50 switches the frequency divider 48 to the other channel n−1. As mentioned above, FIG. 3c shows that the control voltage at the control input 38 of the oscillator 12 decays to the second control voltage value U2 beginning as of the time point t2. Together with the switching-over of the frequency divider 48 at time point t2, the switch 86 of FIG. 2 is opened, as represented by the falling flank at time point t2 in the control signal in FIG. 3f.

FIG. 3g shows the output signal of the subtracting amplifier 64. Up to the time point t1, this output signal was undefined, but then takes on the biasing voltage potential of the biasing voltage source 80 shown in FIG. 2, as of the time point t1, i.e. after switching the subtracting amplifier 64 into the first switching position as described above. Thereafter, the output signal of the subtracting amplifier 64 maintains this biasing voltage potential until the time point t3, at which the subtracting amplifier 64 is switched over into its second switching position.

This switching-over into the second switching position is illustrated, among other things, in FIG. 3e, in which the rising flank of the illustrated control signal causes the switch 90 in FIG. 2 to close. Simultaneously at time point t3, the falling flank of the signal in FIG. 3d opens the switches 88 and 92. Also simultaneously at time point t3, the new rising flank of the signal in FIG. 3f causes a renewed closing of the switch 86 in FIG. 2.

As has been described above in connection with FIG. 2, thereupon a recharging of the capacitor 82 of FIG. 2 takes place, whereby this recharging is proportional to the difference between the control voltage values U1 and U2. Thus, due to the integrator function of the subtracting amplifier 64 in FIG. 2 in the second switching position, the output voltage of the operational amplifier 78 therefore varies by an amount that is proportional to the difference between the control voltage values U1 and U2. This is illustrated by the corresponding drop in the output signal of the subtracting amplifier 64 at time t3 as shown in FIG. 3g.

As soon as the value of the output signal in FIG. 3g has been quiescently established after the initial transient, the digital control unit 50 will trigger a conversion of this value into a digital value through the analog/digital converter 66, as illustrated or represented by the rising flank in FIG. 3h. As soon as the analog/digital converter 66 is finished with the conversion, it provides a corresponding signal from its output 70 to the digital control unit 50. Then, by using the value determined in the analog/digital converter 66, the control unit 50 sets the correct modulation swing in the modulation generator 45 and then also switches the frequency divider 48 to its normal frequency, i.e. the channel n.

FIG. 3i shows the resulting signal at the modulation input 40 of the oscillator 12. Note that the signal at the modulation input 40 as shown in FIG. 3i is identical to the signal at the output of the loop filter 44 as shown in FIG. 3c, during the time of the adjusting or balancing operation. Then, after the adjusting or balancing process, the resulting signal at the modulation input 40 of the oscillator 12 additionally includes the modulation (alternating) voltage having an exactly defined amplitude superposed on the d.c. voltage at the loop filter output.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. A circuit apparatus comprising:
    a resonant circuit having a resonant circuit input and a resonant circuit output;
    a frequency determining network including first and second network branches connected in parallel between a common network junction and said resonant circuit input, wherein said first network branch includes a control input between said common network junction and said resonant circuit input, and said second network branch includes a modulation input between said common network junction and said resonant circuit;
    a frequency regulating circuit connected between said resonant circuit output and said control input;
    a modulation generator having a data input adapted to receive a data signal, a modulation swing adjustment input, and a modulation signal output connected to said modulation input; and
    a modulation swing adjusting circuit that is connected between said control input and said modulation swing adjustment input, and that includes a time-discrete voltage subtracting arrangement.

2. The circuit apparatus according to claim 1, wherein:
    said modulation swing adjusting circuit including said time-discrete voltage subtracting arrangement is adapted to sample and subtract first and second voltages existing at different first and second times at said control input, and to provide to said modulation swing adjustment input an adjustment signal responsive to and dependent on a difference between said first and second voltages; and
    said modulation generator is adapted to generate at said modulation signal output a modulation voltage in response to and dependent on said data signal received at said data input, wherein said modulation voltage has an oscillation range responsive to and dependent on said adjustment signal.

3. The circuit apparatus according to claim 1, wherein said frequency regulating circuit includes a frequency divider that can be switched among plural different frequencies.

4. The circuit apparatus according to claim 3, wherein said frequency divider is connected to said resonant circuit output, and said frequency regulating circuit further includes a phase/frequency detector and a loop filter connected in series between said frequency divider and said control input, and a reference frequency source further connected to said phase/frequency detector.

5. The circuit apparatus according to claim 1, wherein:
    said first network branch of said frequency determining network includes at least a first varactor connected between said common network junction and said control input, and a first capacitor connected between said control input and said resonant circuit input; and
    said second network branch of said frequency determining network includes at least a second varactor connected between said common network junction and said modulation input, and a second capacitor connected between said modulation input and said resonant circuit input.

6. The circuit apparatus according to claim 1, wherein said modulation swing adjusting circuit comprises an operational amplifier having a non-inverting input connected to said control input, and an inverting input and an output connected to each other and to said voltage subtracting arrangement.

7. The circuit apparatus according to claim 6, further comprising a resistor connected between said modulation input and said output of said operational amplifier.

8. The circuit apparatus according to claim 1, wherein said time-discrete voltage subtracting arrangement comprises a subtracting element that comprises:
    an operational amplifier with an inverting input, a non-inverting input, and an amplifier output;
    a first capacitor connected to said inverting input;
    a first switch connected directly or indirectly between said control input and said first capacitor;
    a biasing voltage source connected to said non-inverting input;
    a second switch connected between said inverting input and said amplifier output;
    a second capacitor connected to said inverting input;
    a third switch connected between said second capacitor and said amplifier output; and
    a fourth switch connected between said second capacitor and said non-inverting input.

9. The circuit apparatus according to claim 8, wherein said modulation swing adjusting circuit further comprises a digital control unit that is connected to and adapted to control said first, second, third and fourth switches.

10. The circuit apparatus according to claim 1, wherein said modulation swing adjusting circuit further comprises an analog/digital converter, a memory, and a digital/analog converter with a current output connected in series between said voltage subtracting arrangement and said modulation swing adjustment input.

11. A method of driving a circuit apparatus including an oscillator and a frequency regulating circuit, wherein said oscillator has an output, a control input and a modulation input, and wherein said frequency regulating circuit is connected between said output and said control input, is selectively switchable among plural frequencies, and is adapted to provide control voltages at said control input, said method comprising the steps:
    a) switching said frequency regulating circuit to a first frequency, which establishes a first control voltage at said control input;
    b) sampling and holding said first control voltage;
    c) switching said frequency regulating circuit to a second frequency, which establishes a second control voltage at said control input;
    d) sampling and holding said second control voltage;
    e) forming a difference between said first and second control voltages;
    f) generating a modulation voltage dependent on said difference, so that an oscillation range of said modulation voltage is determined by said difference; and
    g) applying said modulation voltage to said modulation input.

12. A circuit apparatus comprising:
    a phase regulating loop including a d.c. signal controlled oscillator that comprises a d.c. signal sensitive network of frequency determining components having a control input and a modulation input, and including control components having a control output connected and adapted to provide a d.c. control signal to said control input;

a modulation generator having a modulation signal output connected and adapted to provide a modulation signal to said modulation input; and a circuit arrangement that comprises an impedance converter and a resistor connected in series between said control input and said modulation input, with said impedance converter connected to said control input, and wherein said circuit arrangement has a sampling input connected to said phase regulating loop and a slope signal output connected to a slope signal input of said modulation generator;

wherein said circuit arrangement is adapted to autonomously provide via said slope signal output to said slope signal input a slope signal dependent on and indicative of a slope of a modulation of said modulation signal based on a signal received at said sampling input;

wherein said modulation generator is adapted to generate said modulation signal dependent on said slope signal; and wherein said frequency determining components comprise diodes respectively having voltage-dependent capacitances, said network comprises first and second diode circuits of said diodes, said first diode circuit is coupled to said control input, said second diode circuit is coupled to said modulation input, and said first and second diode circuits are connected parallel to each other.

13. The circuit apparatus according to claim 12, wherein said modulation generator further has a data input, and generates said modulation signal further dependent on a data signal received at said data input.

14. The circuit apparatus according to claim 12, wherein said impedance converter is connected to and interposed between said sampling input and said control output.

15. The circuit apparatus according to claim 12, wherein:
said circuit arrangement comprises a digital control unit having a first control output; and
said control components of said phase regulating loop comprise a frequency divider that is switchable among plural different frequencies, and that is coupled to said oscillator, and that has a control input connected to said first control output of said digital control unit so that said digital control unit thereby controls said frequency divider.

16. The circuit apparatus according to claim 15, wherein said network of frequency determining components is designed so that a first ratio of slopes with which said oscillator reacts to changes of said control signal and changes of said modulation signal corresponds to a second ratio of a frequency difference between respective ones of said different frequencies upon a switching of said frequency divider relative to a modulation swing of said modulation signal.

17. The circuit apparatus according to claim 16, wherein said oscillator further comprises a core resonant circuit, said diodes respectively have a voltage-dependent depletion layer capacitance, and said first and second diode circuits are both connected in common to said resonant circuit.

18. The circuit apparatus according to claim 17, wherein said control components are adapted to generate and provide said d.c. control signal as a d.c. voltage signal at said control output.

19. The circuit apparatus according to claim 12, wherein said circuit arrangement further comprises a time-discrete subtracting element having an input connected to an input or an output of said impedance converter so as to detect first and second voltages prevailing at said input or said output of said impedance converter in a time-discrete manner respectively in first and second switching positions of a switchable frequency divider comprised by said control components, and having an output adapted to provide a difference between said first and second voltages as said slope signal or a precursor of said slope signal.

20. The circuit apparatus according to claim 19, further comprising a digital control unit that is connected to and adapted to control said subtracting element.

21. The circuit apparatus according to claim 19, wherein said circuit arrangement further comprises an analog/digital converter connected to said output of said subtracting element to receive and convert said difference into a digital signal, a memory connected to said analog/digital converter to store said digital signal, and a digital/analog converter that is connected to said memory to receive and convert said digital signal into a control current as said slope signal, and that has a control current output as said slope signal output by which said control current as said slope signal is provided to said slope signal input of said modulation generator.

22. The circuit apparatus according to claim 12, wherein said circuit arrangement further comprises a time-discrete subtracting element having said sampling input connected to said control output and said control input so as to detect first and second voltages prevailing at said sampling input in a time-discrete manner respectively in first and second switching positions of a switchable frequency divider comprised by said control components, and having an output adapted to provide a difference between said first and second voltages as said slope signal or a precursor of said slope signal.

23. A circuit apparatus comprising:
a phase regulating loop including a d.c. signal controlled oscillator that comprises a carrier frequency output adapted to output a carrier frequency signal, a d.c. signal sensitive network of frequency determining components having a control input and a modulation input, and including control components having a control output connected and adapted to provide a d.c. control signal to said control input;

a modulation generator having a data signal input, and having a modulation signal output that is connected and adapted to provide a modulation signal to said modulation input;

a signal emitter connected to said data signal input of said modulation generator and adapted to provide, to said data signal input, a data signal of data that is to be modulated onto and transmitted via said carrier frequency signal; and a circuit arrangement that has a sampling input connected to said phase regulating loop and a slope signal output connected to a slope signal input of said modulation generator;

wherein said circuit arrangement is adapted to autonomously provide via said slope signal output to said slope signal input a slope signal dependent on and indicative of a slope of a modulation of said modulation signal based on a signal received at said sampling input;

wherein said modulation generator is adapted to generate said modulation signal dependent on said slope signal and dependent on said data signal; and wherein said phase regulating loop is adapted to modulate said data onto said carrier frequency signal in response to and dependent on said modulation signal received at said modulation input.

24. The circuit apparatus according to claim 23, wherein said circuit arrangement further comprises an impedance converter and a resistor connected in series between said control input and said modulation input, with said impedance converter connected to said control input.

25. The circuit apparatus according to claim 24, wherein said impedance converter is connected to and interposed between said sampling input and said control output.

26. The circuit apparatus according to claim 23, wherein said frequency determining components comprise diodes respectively having voltage-dependent capacitances, said network comprises first and second diode circuits of said diodes, said first diode circuit is coupled to said control input, said second diode circuit is coupled to said modulation input, and said first and second diode circuits are connected parallel to each other.

27. The circuit apparatus according to claim 23, wherein:
said circuit arrangement comprises a digital control unit having a first control output; and
said control components of said phase regulating loop comprise a frequency divider that is switchable among plural different frequencies, and that is coupled to said oscillator, and that has a control input connected to said first control output of said digital control unit so that said digital control unit thereby controls said frequency divider.

28. The circuit apparatus according to claim 27, wherein said network of frequency determining components is designed so that a first ratio of slopes with which said oscillator reacts to changes of said control signal and changes of said modulation signal corresponds to a second ratio of a frequency difference between respective ones of said different frequencies upon a switching of said frequency divider relative to a modulation swing of said modulation signal.

29. The circuit apparatus according to claim 28, wherein said oscillator further comprises a core resonant circuit, said frequency determining components comprise diodes respectively having a voltage-dependent depletion layer capacitance, said network comprises mutually symmetrical first and second parallel circuits of said diodes, said first parallel circuit is coupled to said control input, said second parallel circuit is coupled to said modulation input, and said first and second parallel circuits are both connected in common to said resonant circuit.

30. The circuit apparatus according to claim 29, wherein said control components are adapted to generate and provide said d.c. control signal as a d.c. voltage signal at said control output.

31. The circuit apparatus according to claim 24, wherein said circuit arrangement further comprises a time-discrete subtracting element having an input connected to an input or an output of said impedance converter so as to detect first and second voltages prevailing at said input or said output of said impedance converter in a time-discrete manner respectively in first and second switching positions of a switchable frequency divider comprised by said control components, and having an output adapted to provide a difference between said first and second voltages as said slope signal or a precursor of said slope signal.

32. The circuit apparatus according to claim 31, further comprising a digital control unit that is connected to and adapted to control said subtracting element.

33. The circuit apparatus according to claim 31, wherein said circuit arrangement further comprises an analog/digital converter connected to said output of said subtracting element to receive and convert said difference into a digital signal, a memory connected to said analog/digital converter to store said digital signal, and a digital/analog converter that is connected to said memory to receive and convert said digital signal into a control current as said slope signal, and that has a control current output as said slope signal output by which said control current as said slope signal is provided to said slope signal input of said modulation generator.

34. The circuit apparatus according to claim 23, wherein said circuit arrangement further comprises a time-discrete subtracting element having said sampling input connected to said control output and said control input so as to detect first and second voltages prevailing at said sampling input in a time-discrete manner respectively in first and second switching positions of a switchable frequency divider comprised by said control components, and having an output adapted to provide a difference between said first and second voltages as said slope signal or a precursor of said slope signal.

* * * * *

UNITED STATES PATENT AND TRADEMARK OFFICE
CERTIFICATE OF CORRECTION

PATENT NO. : 7,129,788 B2
APPLICATION NO. : 10/833418
DATED : October 31, 2006
INVENTOR(S) : Eckert et al.

It is certified that error appears in the above-identified patent and that said Letters Patent is hereby corrected as shown below:

Column 6,
Line 58, after "filter 44," replace "Buch" by --such--;

Column 11,
Line 52, after "that", replace "can be switched" by --is switchable--.

Signed and Sealed this

Fifteenth Day of May, 2007

JON W. DUDAS
*Director of the United States Patent and Trademark Office*